United States Patent

Lang

[11] Patent Number: 5,977,878
[45] Date of Patent: Nov. 2, 1999

[54] CONTROL SWITCH APPARATUS OPERABLE BY AN OBJECT PLACED ADJACENT THERETO AND SPACED THEREFROM

[76] Inventor: Robert K. Lang, 501 Los Pinos Way, San Jose, Calif. 95123

[21] Appl. No.: 08/944,092

[22] Filed: Oct. 2, 1997

[51] Int. Cl.$^6$ .................................................. G08B 5/00
[52] U.S. Cl. ..................... 340/815.4; 340/545.3; 340/686.1; 340/686.6; 340/825.19; 250/221; 250/222.1; 250/229; 315/155
[58] Field of Search ............................. 340/815.4, 686.1, 340/686.6, 825.19, 545.3, 567, 691.1, 693.1; 250/221, 222.1, 229; 315/155, 159

[56] References Cited

U.S. PATENT DOCUMENTS

| | | |
|---|---|---|
| 4,290,043 | 9/1981 | Kaplan ..................................... 340/984 |
| 4,329,581 | 5/1982 | Helfrich, Jr. et al. ................... 250/221 |
| 4,707,867 | 11/1987 | Kawabe et al. ............................... 4/313 |
| 4,735,357 | 4/1988 | Gregory et al. ....................... 236/93 R |
| 5,008,529 | 4/1991 | Nakamura ................................ 250/221 |
| 5,112,630 | 5/1992 | Scott ....................................... 426/233 |
| 5,142,199 | 8/1992 | Elwell ..................................... 315/154 |
| 5,367,158 | 11/1994 | Herman et al. ......................... 250/221 |
| 5,382,791 | 1/1995 | Leff et al. ............................... 250/221 |
| 5,594,238 | 1/1997 | Endruschat et al. . |
| 5,763,872 | 6/1998 | Ness ................................. 250/214 AL |

*Primary Examiner*—Edward Lefkowitz
*Assistant Examiner*—Davetta Woods
*Attorney, Agent, or Firm*—Thomas R. Lampe

[57] ABSTRACT

A "no touch", two state switch is controlled by light emitted thereby which is reflected back to the switch to actuate or deactuate the switch when reflected by a hand or other object spaced from but adjacent to the switch.

16 Claims, 8 Drawing Sheets

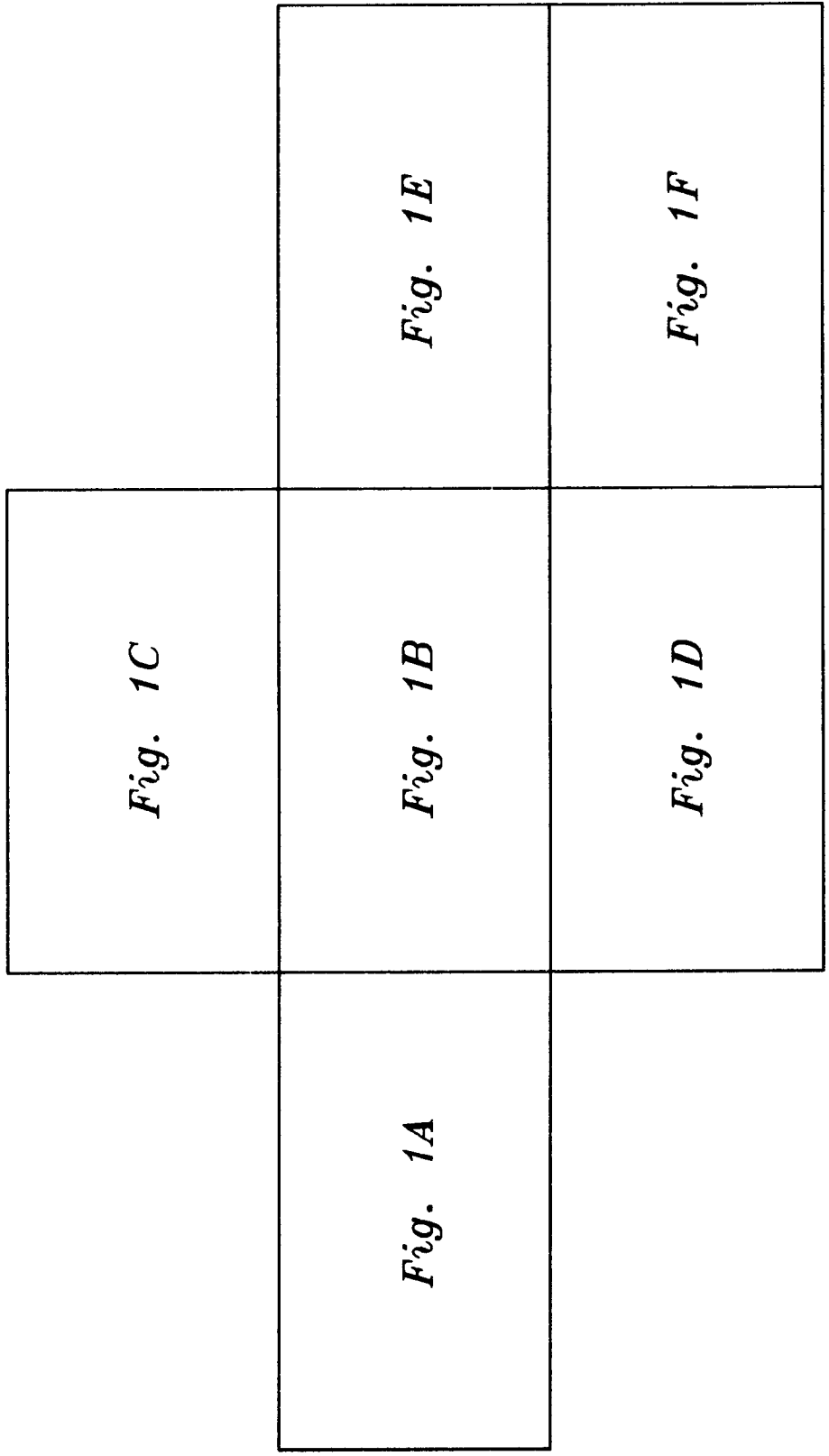

CONTROL SWITCH APPARATUS OPERABLE BY AN OBJECT PLACED ADJACENT THERETO AND SPACED THEREFROM

TECHNICAL FIELD

This invention relates to an electrical switch, more particularly, to a switch which is not operated by contact but rather by a hand or other object placed adjacent thereto and spaced therefrom. The control switch apparatus may replace the conventional toggle style switch commonly employed in dwellings and other buildings.

BACKGROUND OF THE INVENTION

Mechanical toggle-type switches requiring manual contact to operate are in widespread usage. Operation of such devices by persons with wet hands can be hazardous since physical contact with the toggle or handle is necessary. Also, physically impaired persons may have difficulty grasping or manipulating the moveable switch element.

While "no touch" switches are known, such devices typically operate on the principle of switching when an object passes between a source of light and a remote receptor for such light. Such an approach is not practical for use in many operating environments, including the home, as substitutes for simple toggle-type utility switches. A light receptor would have to be placed a considerable distance from the photoelectric or other light source and inadvertent or unwanted actuation of the switch is highly probable. For example, although such prior art arrangements may be suitable in situations where one wishes to actuate a switch when a person's body passes between the source of light and the receptor, such an arrangement would be impracticable if one plans to replace a normal toggle-type switch and its function. That is to say, prior art "no touch" switch devices do not allow the flexibility required insofar as individual switch actuation is concerned. For example, one may not desire to have a particular light or appliance associated with the switch actuated every time he or she passes through a room.

The following patents are believed to be representative of the current state of the prior art with respect to "no touch" switch devices: U.S. Pat. No. 5,382,791, issued Jan. 17, 1995, U.S. Pat. No. 5,008,529, issued Apr. 16, 1991, U.S. Pat. No. 5,367,158, issued Nov. 22, 1994, U.S. Pat. No. 5,142,199, issued Aug. 25, 1992, and U.S. Pat. No. 5,594,238, issued Jan. 14, 1997.

DISCLOSURE OF INVENTION

The present invention provides a safe alternative to the conventional toggle-type utility switch and one may operate the switch with the same degree of control one has with respect to a toggle-type switch. While no physical contact is required to operate the switch of the present invention, the switch cannot be operated until a hand (or other object) is placed into relatively close proximity to the switch. Therefore, the control switch apparatus disclosed and claimed herein is highly unlikely to be actuated unless one makes a positive effort to do so. A person merely passing through a room will not actuate the control switch apparatus.

The control switch apparatus of the present invention is operable by an object placed adjacent thereto and spaced therefrom.

The control switch apparatus includes light source means for emitting light and for directing the light externally of the control switch.

Light receiving means is located adjacent to the light source means.

The apparatus further includes switch means and means responsive to reflection of light emitted by the light source means by an object placed adjacent to the control switch apparatus and spaced therefrom to the light receiving means to either open the switch means or close the switch means. In the preferred embodiment disclosed herein the light source means comprises a source of infrared light.

Other features, advantages, and objects of the present invention will become apparent with reference to the following description and accompanying drawings.

BRIEF DESCRIPTION OF DRAWINGS

FIGS. 1 and 1A through 1F illustrate a detailed circuit diagram of control switch apparatus constructed in accordance with the teachings of the present invention;

BEST MODE FOR CARRYING OUT THE INVENTION

Figure 1A:
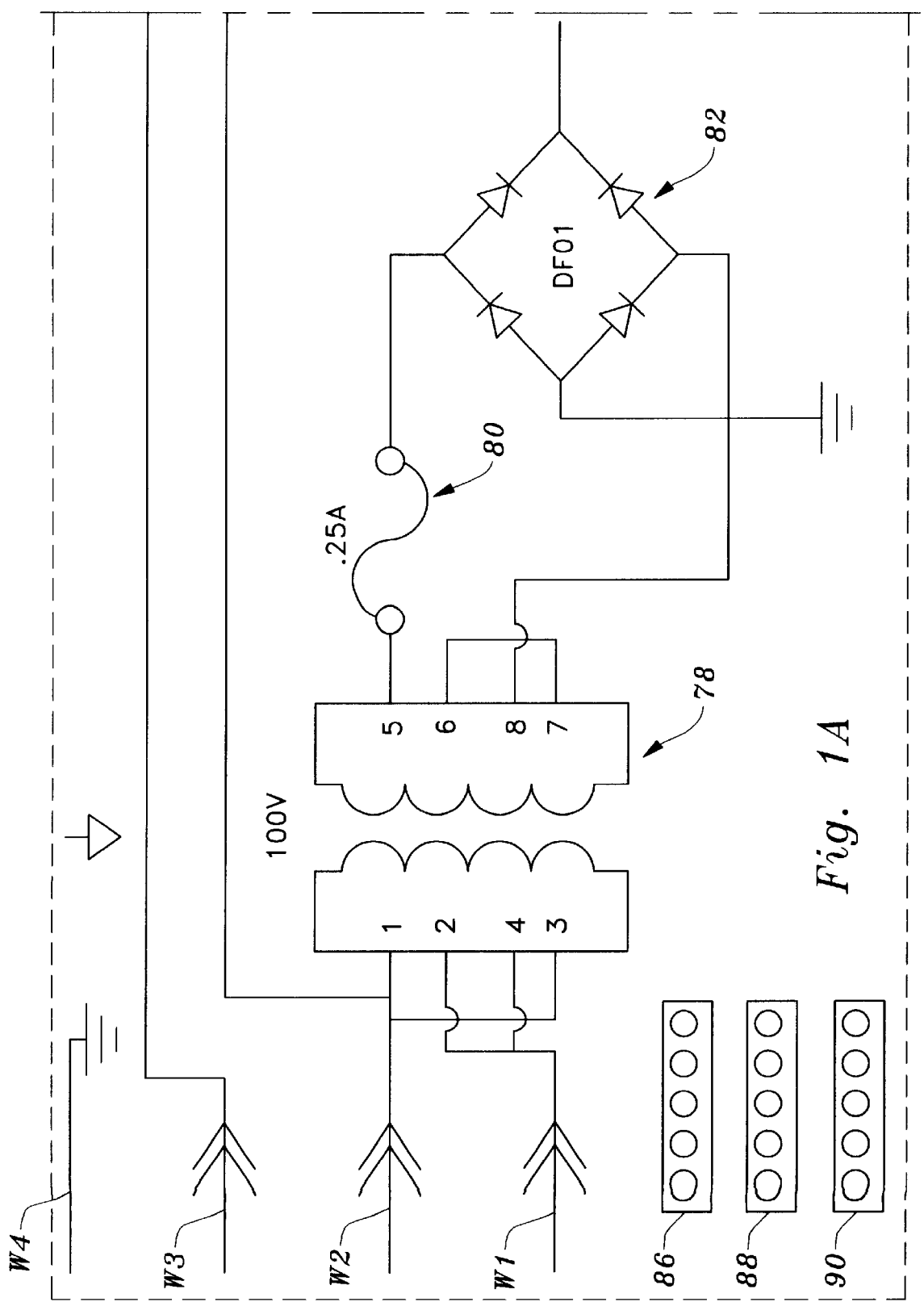
Figure 1B:
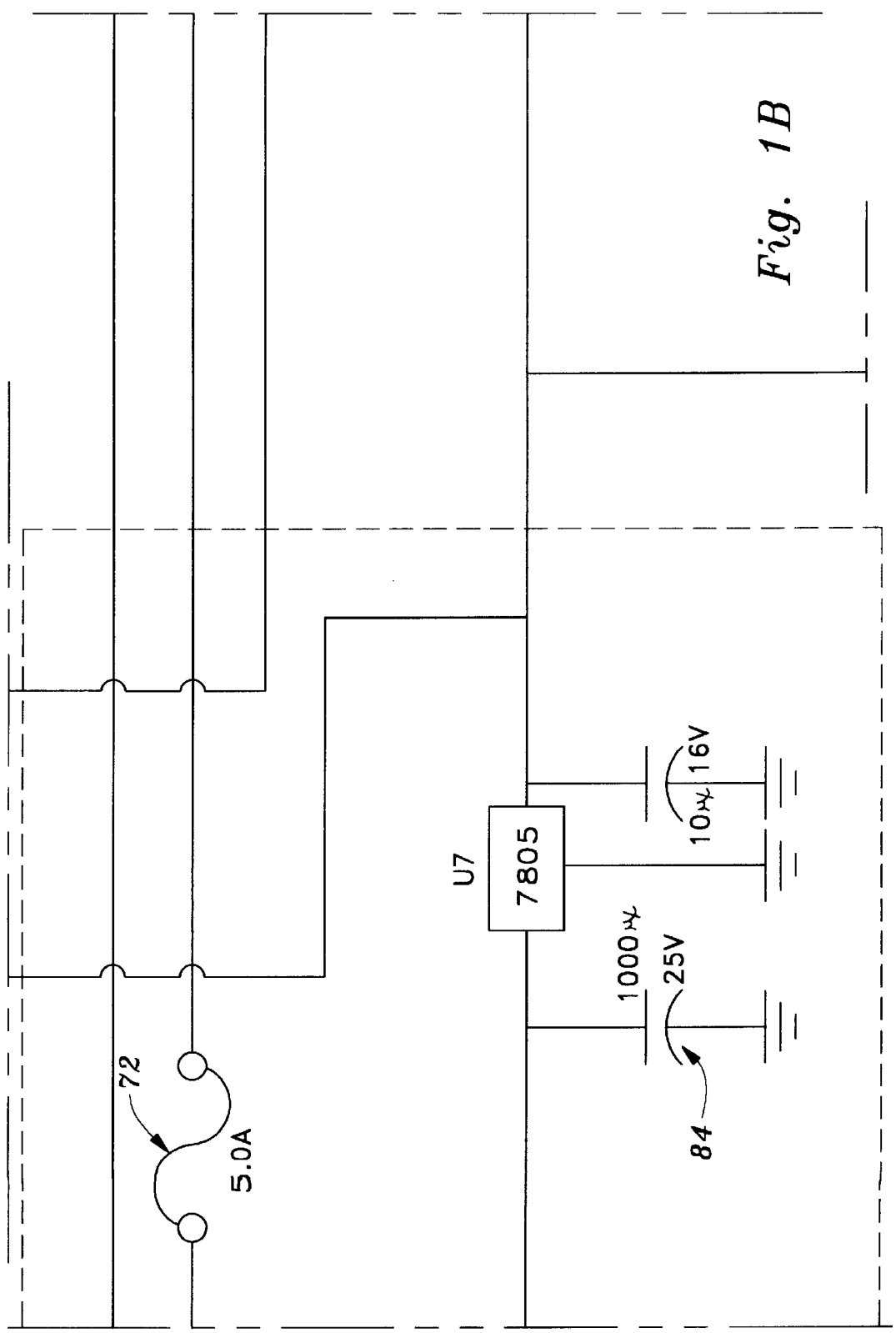
Figure 1C:
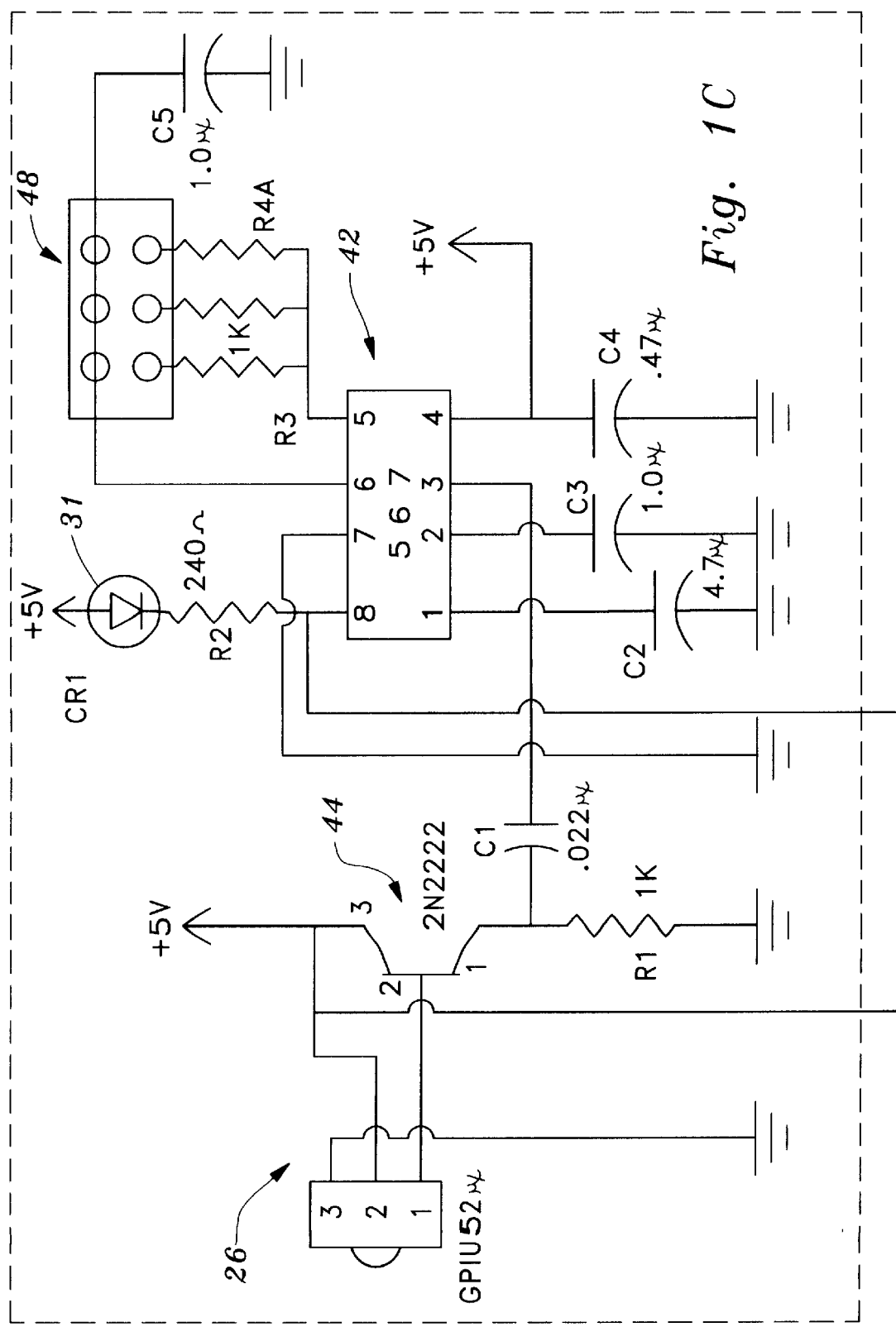

Control switch apparatus constructed in accordance with the teachings of the present invention, as shown in the drawings, is particularly useful for use in kitchens, bathrooms or other environments where moisture on hands is a possibility; however, the apparatus may be employed as a replacement for conventional toggle-type switches in any environment. The apparatus readily may be used to operate one or more lights or electrically operated appliances.

Figure 3:
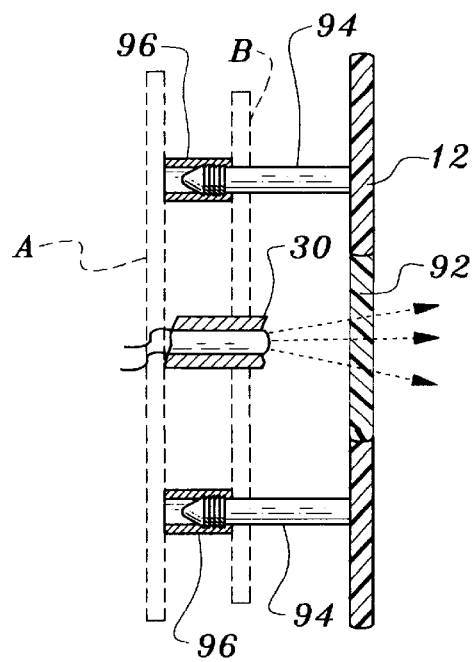
FIG. 3 is a simplified diagrammatic representation of selected components of the control switch apparatus including an infrared LED, a segment of a housing having a semi-transparent window for the passage of light therethrough, and segments of two spaced printed circuit boards.

The control switch apparatus illustrated requires 110 v A.C. to operate and would typically include a water resistant faceplate which would cover the electrical components and the receptacle into which the apparatus is placed. FIG. 3 illustrates a segment of a faceplate 12. Also shown in that figure by dash line representation are segments of two printed circuit boards A and B which are separated by any desired expedient, such as nylon standoffs, within the housing. The lower or innermost card A is the power supply board while the upper or outermost card B is the control board. Because of the space limitation requirements associated with a utility switch apparatus of this type it is preferred that the upper card have no protruding parts. This may be accomplished by the use of surface mount parts and by fabricating cutouts in the upper board through which larger parts mounted on the lower board would protrude.

The control board B consists of a number of subcircuits employed in the circuit disclosed in FIGS. 1 and certain of the FIGS. 1A through 1F, namely, those relating to the transmitter, receiver, display, tone, latch delay, switching and pon reset sub-circuits.

The pon reset circuit 20 consists of a LM2905 (precision timer) which sets the switch to zero (off) exactly one second after a power-up. By configuring the LM2905 to collector output, this circuit will send a one second low pulse to pin 1 (set) of flip-flop 22 upon power-up.

This low pulse sets the flip-flop 22 to a zero state then goes high, therefore enabling the switch to toggle upon demand. This is required not only for safety reasons but also for conservation of electrical energy during a power-out, and subsequent power-up situation.

A receiver/demodulator 26 and a transmitter IR LED 30 are preferably positioned less than one inch from each other essentially along the same plane. With this arrangement it becomes necessary to take precautions so that the receiver does not detect stray IR radiation flooding from the LED 30. This is accomplished by using an LED with a 20 degree dispersion angle and by fitting the IR LED with an aperture to columnate or narrow the beam.

Figure 1D:
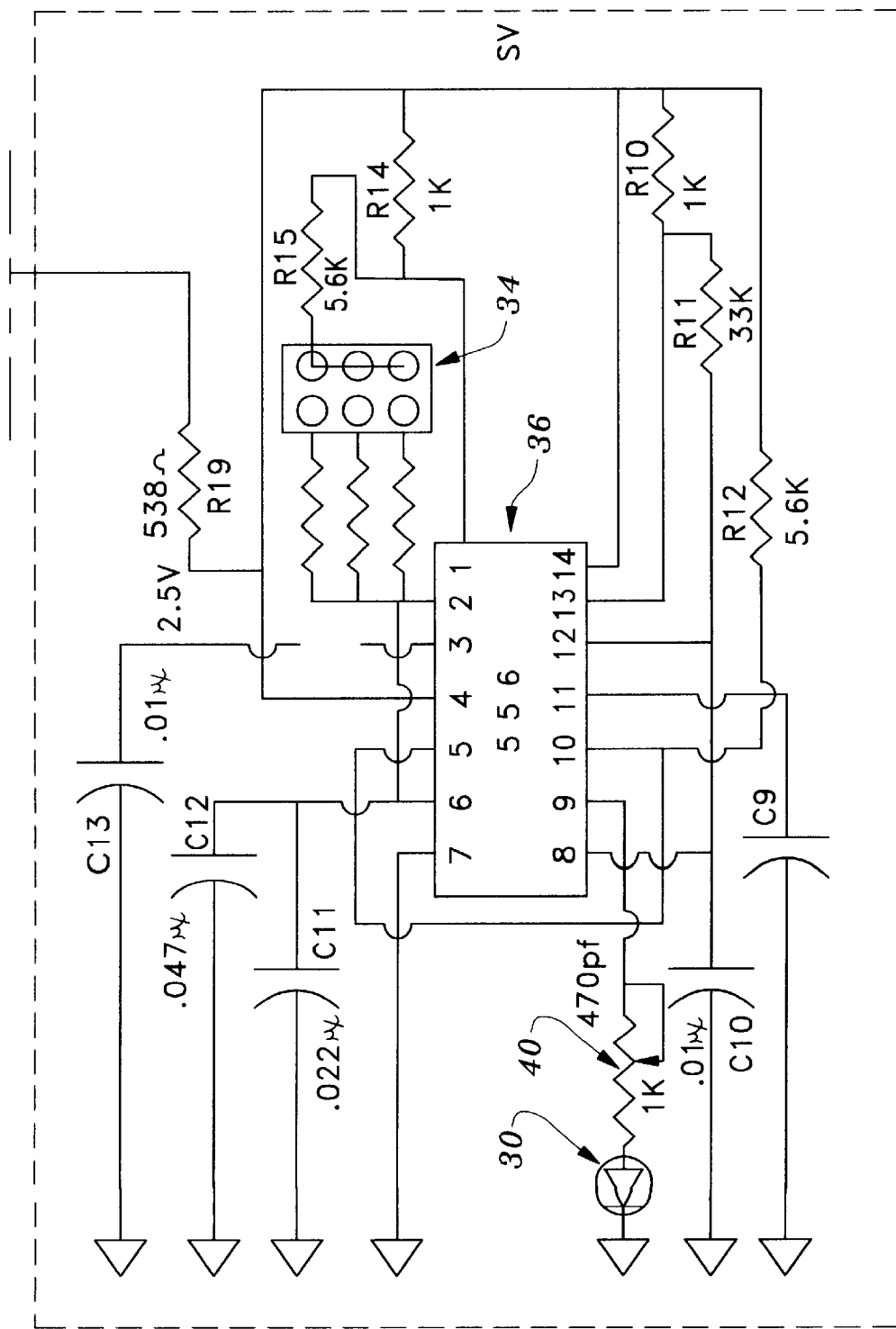
Figure 1E:
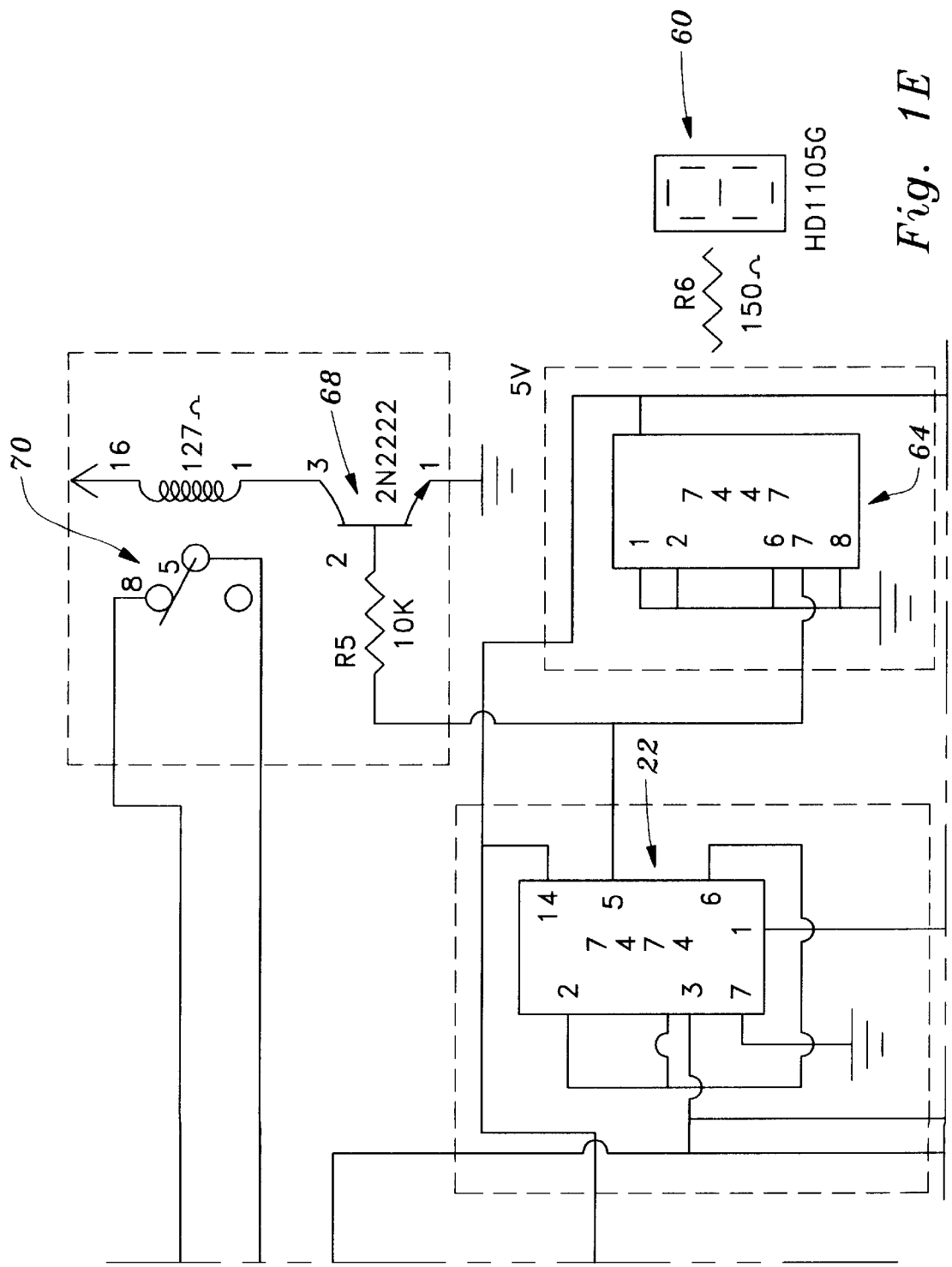
Figure 1F:
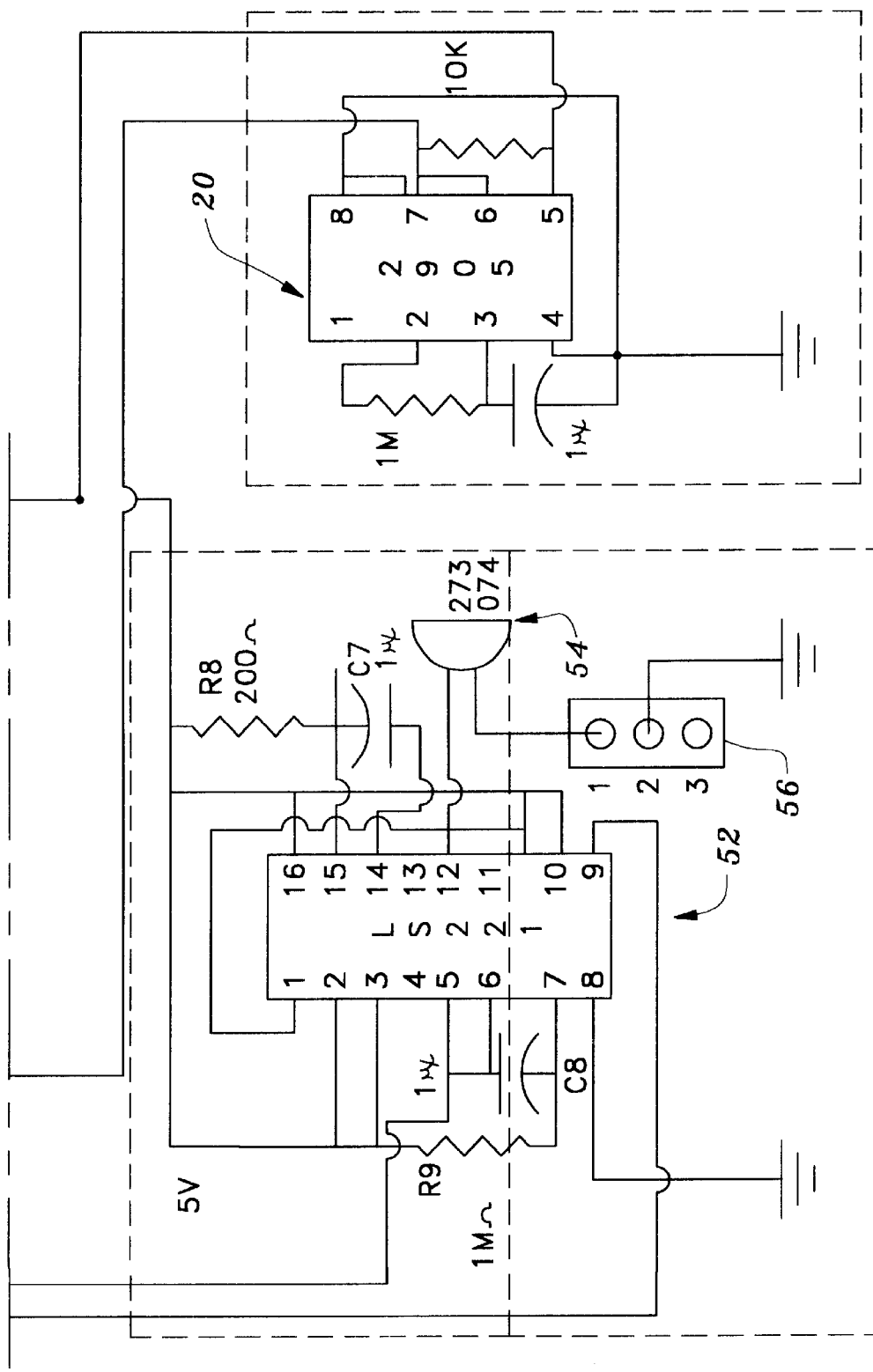
Figure 2:
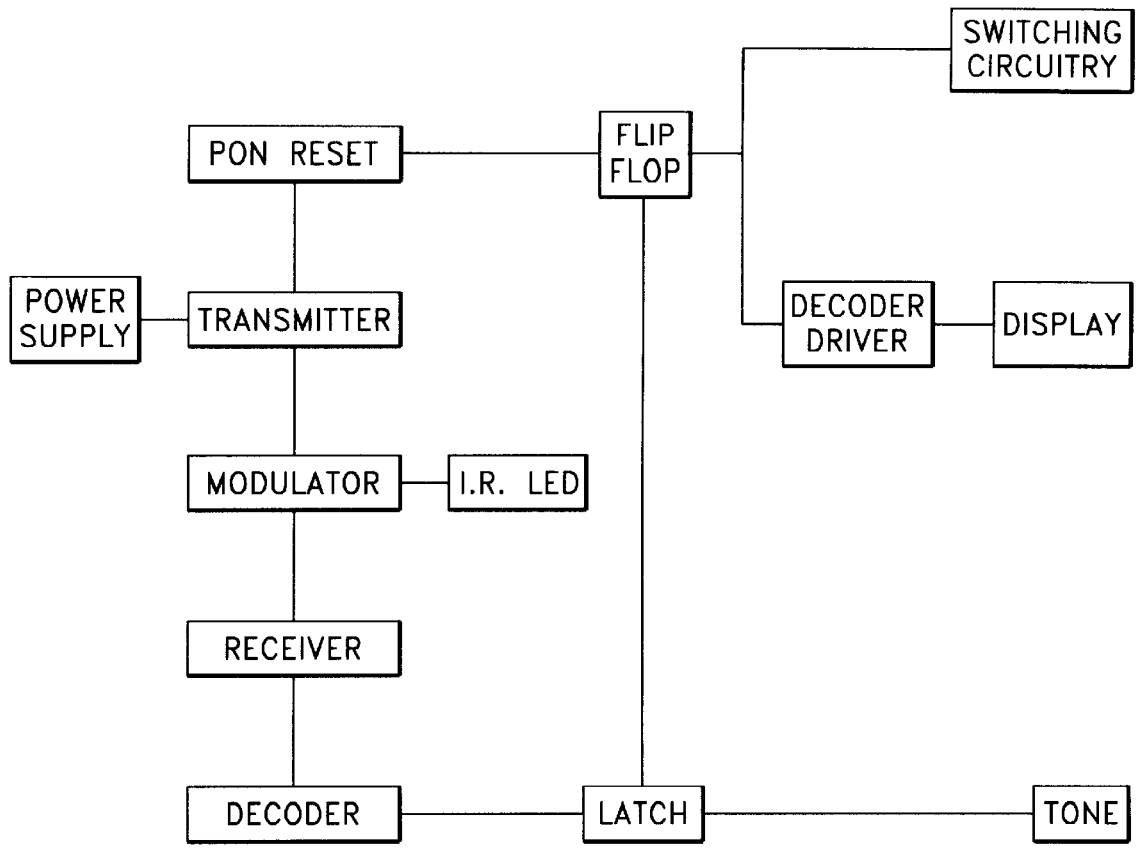
FIG. 2 is a block diagram illustrating the cooperative relationship existing between components of the apparatus.

The transmitter circuit shown in FIG. 1D contains the IR LED 30, the LED being mounted on the bottom board but protruding through the upper board as illustrated in FIG. 3. This LED pulses at 40 k hz and is accompanied by any one of three modulated frequencies that are selectable by the jumper on jumper pins 34. The LED is constantly active. If three switches are to be ganged side by side through the use of jumper pins 34, each switch can operate on a different frequency and therefore be enabled by a hand held remote control independently.

The 40 k hz pulse and carrier frequency are created through the use of a dual timer 36 and supporting circuitry. The first timer in this dual package is preferably configured to oscillate at either 850 hz, 1000 hz or 1150 hz depending on which jumper pins are employed. The oscillator output drives the second timer which runs at 40 k hz and drives the LED 30. This circuit is constantly enabled and provides IR radiation that will be reflected back toward the receiver if an object is within sensing range. Through the use of a potentiometer 40 the intensity of the LED can be controlled to vary the sensing distance of the switch from one to twelve inches.

The receiver circuit is comprised of a tone decoder 42, an amplifier 44, and receiver/demodulator package 26. This arrangement lowers the possibility of false switching from solar radiation.

Tone decoder 42 is set to accept any one of the three frequencies available from the transmitter as defined by the jumper location on jumper pins 34 by placing the jumper associated with jumper pins 48 in that same pin location. Since receiver/demodulator 26 is set to accept a signal of 40 k hz and tone decoder 42 is set to receive the corresponding carrier transmitter frequency, a reflected beam from the transmitter will cause pin 8 of tone decoder 42 to go low, lighting the LED 31, therefore enabling the latch delay and causing the switch to toggle. Any other radiation pattern will be rejected. LED 31, when lit, indicates that the receiver circuitry is receiving a signal within the passband.

A small hand held remote control (not shown) with three contacts made up of transmitter circuitry as previously described above but powered by two 3V lithium batteries, shall also be mentioned. Upon receiving a low signal from the decoder 42, the latch circuit 52 is enabled. This latch-delay circuit ultimately toggles the flip-flop 22. Because of the quick response time of the receiver circuit the latch-delay circuit has been implemented. Without this latch circuit that disables the flip-flop for a period of one second, the open spaces between a person's fingers would be sensed, causing the relay to enable and disable a number of times as the hand was passed in front of the switch window. This subcircuit is one of the multivibrators of the dual monostable multivibrator of latch circuit 52 configured as a one-shot with a pulse duration of one second. This pulse holds the clock of flip-flop 22 high, thereby disabling its switching function for that period. The tone circuit is comprised of the remaining multivibrator incorporated into latch circuit 52 and supporting circuitry. This subcircuit is configured as a one-shot with a positive pulse of 200 msec. and is activated through the one second latch delay subcircuit whenever it is energized. Upon application of this pulse the piezo buzzer 54 is enabled, creating a short audible tone indicating that the switch has changed state. The tone can either be enabled or disabled by the use of a jumper 56 which suitably is in a convenient place on the board under the faceplate.

A display circuit illuminates the switch so it is easily located in the dark by the use of a seven-segment display (or optional yellow and green LED pattern). The display 60 will either be the digit one or zero; the zero designating that the switch is in the off position. With the optional display pattern the yellow display would indicate the off position. The flip-flop 22, upon receiving a signal from the latch circuitry, will output either a high or low voltage which is seen as an input at pin 7 of the decoder/driver 64. The display, which is driven by a seven-segment decoder/driver 64, will either show a one or a zero depending on the state of flip-flop output. The flip-flop 22 not only functions as the means for defining the state of the display but also drives the transistor 68 which enables or disables the five amp relay 70 located on the power supply board A. The relay 70 performs the actual switching of the current from the source to the load. This higher voltage portion of the switch is located on the lower printed circuit board A and is protected by a replaceable five amp fuse 72 fitted into miniature fuse clips (not shown) also located on the lower printed circuit board.

The bottom board (power supply board) delivers a filtered and regulated 5 volts d.c. to the logic circuitry through the use of a 10 volt a.c. stepdown transformer rated at 250 ma. This board incorporates various power supply components and also the seven-segment display 60, the I.R. LED 30 and the receiver/demodulator 26. The latter three components are mounted on this card to avoid height clearance problems with the faceplate. They can protrude through holes formed in the upper board.

Incorporated into the lower board is an optional display circuit. This display circuit can be implemented to use the more conventional yellow and green LED pattern to indicate the state of the switch instead of the seven-segment display. Yellow denotes switch off while green indicates that the switch is on.

The power supply is made up of a stepdown transformer 78, a 250 ma. pico fuse 80 that protects the 5 volt logic circuit, a full wave bridge rectifier 82, a filter capacitor 84, and positive 5 volt fixed regulator. The stepdown transformer 78 reduces the voltage from 110 v a.c. to 10 v a.c. The pico fuse 80 rated at 250 ma. protects the logic circuit from shorts and ensures the circuit will not draw more than the fuse rating. The full wavebridge rectifier 82 converts the a.c. voltage to d.c. and also boosts the frequency from 60 hz to 120 hz. The filter capacitor 84 converts the raw d.c. to a smooth ripple to satisfy the 5 v logic circuit. The positive 5 volt regulator delivers a fixed voltage to the logic circuitry. The illustrated complete control circuit has been designed to operate exclusively by 5 volts d.c.

The switching component 70 and its fuse 72 are the last two components to be described that reside on the lower board. Member 70 is a 5 volt Omron relay that is rated to pass a maximum of 5 amps at 110 v a.c. The relay is controlled (via the five pin connecter 86-see FIG. 1A) by transistor 68 which is mounted on the upper control board B. The relay 70 performs the actual switching between the supply voltage and signals from lower board to upper board are linked via the three connectors 86, 88 and 90 (FIG. 1A). Each of these connectors contain five pins and are responsible for passing signals from one board to another. The complete circuit including both boards consumes 125 ma. when switch is on and 98 ma with switch off.

A rectangular plastic rear cover (not shown) preferably completely encloses the power supply board and mates to the underside of the lower board by use of self tapping screws (not shown) thus eliminating the possibility of contact between any electrical part of the switch control apparatus and the gang box or electrical receptacle. This control switch apparatus may be connected to existing supply wiring within the receptacle or gang box by use of any suitable expedient such as four 14 ga. stranded copper wires and conical screw type wire connectors (not shown). These four wires protrude from the rear of the control switch apparatus through holes in the rectangular plastic cover. Two of these wires, wires W1, W2 (see FIG. 1A), will be connected to the 110 v a.c. supply. One wire, wire W4, will be connected to the ground and one wire, wire W3, will be connected to the load.

The faceplate 12, which is preferably secured to the front surface of the control board by suitable means, such as serrated plastic tips 94 that are molded onto the rear of the faceplate and that project into and engage the nylon standoffs 96 that separate the control board from the power supply board, is suitably formed of acrylic butyrate styrene. A semi-transparent element in the form of a lens or window 92 of smoked acrylic plastic that suitably is ellipsoidal in shape is located in the faceplate. The element 92 performs two functions. First, because it is not fully transparent, it limits the amount of IR dispersion to the outside generally, therefore decreasing the range of the switch sensitivity. Second, the lens masks the parts and traces below, creating a smooth, streamlined appearance without any holes or openings. Moisture cannot penetrate the switch through the faceplate 12 or element 92, therefore creating a safer environment for the user.

Changes can be made to the apparatus without departing from the spirit or scope of the invention. For example, the power supply utilized could be of a type other than that specifically shown. A power supply utilizing an RC charge, discharge circuit could be employed.

I claim:

1. Control switch apparatus operable by a hand or other light reflective object placed adjacent thereto and spaced therefrom for controlling the flow of electricity through an electrical circuit, said control switch apparatus comprising, in combination:

light source means for emitting light and for directing said light externally of said control switch;

light receiving means adjacent to said light source means;

switch means alternately having either an open condition wherein said switch means is open or a closed condition wherein said switch means is closed;

switch actuator means responsive to reflection of light emitted by said light source means by an object placed adjacent to said control switch apparatus and spaced therefrom to said light receiving means to actuate said switch means to change an initial condition of said switch means by either opening said switch means whereby said switch means assumes said open condition or closing said switch means whereby said switch means assumes said closed condition; and means for maintaining said switch means in the open or closed condition caused by placement of said object adjacent to said control switch apparatus after said object has been moved away from said control switch apparatus until the same or another object is placed adjacent to said control switch apparatus to reflect light from said light source means to said light receiving means and said switch means is returned to said initial condition by said switch actuator means in response thereto.

2. The control switch apparatus according to claim 1 wherein said light source means comprises a source of infrared light.

3. The control switch apparatus according to claim 2 wherein said source of infrared light includes an infrared LED.

4. The control switch apparatus according to claim 3 additionally comprising means for configuring infrared light from said infrared LED into a narrow beam of infrared light.

5. The control switch apparatus according to claim 2 additionally comprising means for varying the intensity of infrared light emitted by said source of infrared light.

6. The control switch apparatus according to claim 1 additionally comprising reset circuit means for opening said switch means responsive to energization of said control switch apparatus by a source of electricity operatively associated with said control switch apparatus.

7. The control switch apparatus according to claim 6 wherein said reset circuit means includes timer means for delaying opening of said switch means for a predetermined period of time after energization of said control switch apparatus by said source of electricity.

8. The control switch apparatus according to claim 1 additionally comprising latch circuit means operatively associated with said switch means and with said light receiving means to prevent opening of said switch means until reflected light is received by said light receiving means for an uninterrupted predetermined period of time.

9. The control switch apparatus according to claim 1 additionally comprising indicator means operatively associated with said switch means for indicating whether said switch means is open or closed.

10. The control switch apparatus according to claim 9 wherein said indicator means comprises means for producing audible sound.

11. The control switch apparatus according to claim 9 wherein said indicator means comprises visual display means.

12. The control switch apparatus according to claim 1 additionally comprising carrier wave generator means for generating a carrier wave of a modulated predetermined frequency accompanying light emitted by said light source means.

13. The control switch apparatus according to claim 12 including means for varying the frequency of said carrier wave.

14. The control switch apparatus according to claim 2 additionally comprising a semi-transparent element positioned adjacent to said source of infrared light through which infrared light emitted by said source of infrared light passes and is attenuated thereby.

15. Control switch apparatus operable by an object placed adjacent thereto and spaced therefrom, said control switch apparatus comprising, in combination:

light source means for emitting light and for directing said light externally of said control switch;

light receiving means adjacent to said light source means;

switch means;

means responsive to reflection of light emitted by said light source means by an object placed adjacent to said control switch apparatus and spaced therefrom to said light receiving means to either open said switch means or close said switch means; and reset circuit means for opening said switch means responsive to energization of said control switch apparatus by a source of electricity operatively associated with said control switch apparatus, said reset circuit means including timer means for delaying opening of said switch means for a predetermined period of time after energization of said control switch apparatus by said source of electricity.

16. Control switch apparatus operable by an object placed adjacent thereto and spaced therefrom, said control switch apparatus comprising, in combination:

light source means for emitting light and for directing said light externally of said control switch;

light receiving means adjacent to said light source means;

switch means;

means responsive to reflection of light emitted by said light source means by an object placed adjacent to said control switch apparatus and spaced therefrom to said light receiving means to either open said switch means or close said switch means;

carrier wave generator means for generating a carrier wave of a modulated predetermined frequency accompanying light emitted by said light source means; and means for varying the frequency of said carrier wave.

* * * * *